(12) United States Patent
Lee (10) Patent No.: US 9,806,185 B2
(45) Date of Patent: Oct. 31, 2017

(54) NON-VOLATILE MEMORY DEVICE AND METHOD OF MANUFACTURING THE SAME

(71) Applicant: SK hynix Inc., Gyeonggi-do (KR)

(72) Inventor: Dong Kee Lee, Seoul (KR)

(73) Assignee: SK Hynix Inc., Gyeonggi-do (KR)

(*) Notice: Subject to any disclaimer, the term of this patent is extended or adjusted under 35 U.S.C. 154(b) by 29 days.

(21) Appl. No.: 13/716,078

(22) Filed: Dec. 14, 2012

(65) Prior Publication Data
US 2014/0061748 A1   Mar. 6, 2014

(30) Foreign Application Priority Data

Aug. 29, 2012  (KR) .................. 10-2012-0095036

(51) Int. Cl.
  H01L 29/78    (2006.01)
  H01L 21/02    (2006.01)
  (Continued)

(52) U.S. Cl.
  CPC ........ H01L 29/78 (2013.01); H01L 21/02365 (2013.01); H01L 27/11529 (2013.01);
  (Continued)

(58) Field of Classification Search
  CPC ......... H01L 27/11526; H01L 27/11529; H01L 27/11531; H01L 27/11551;
  (Continued)

(56) References Cited

U.S. PATENT DOCUMENTS 6,293,149 B1 *  9/2001  Yoshida .............. G01P 15/0802
                                                      438/52
2002/0071989 A1 *  6/2002  Verma ................. H01M 2/0207
                                                      429/176
(Continued)

FOREIGN PATENT DOCUMENTS

KR     10-0222897      10/1999
KR     1020100013956    2/2010

OTHER PUBLICATIONS

Kirt R. Williams, Kishan Gupta, Matthew Wasilik, Etch Rates for Micromachining Processin—Part II,Journal of Microelectromechanical Systems, vol. 12, No. 6, Dec. 2003 pp. 761-778.*

(Continued)

Primary Examiner — Tom Thomas
Assistant Examiner — John Bodnar
(74) Attorney, Agent, or Firm — IP & T Group LLP (57) ABSTRACT

A non-volatile memory device and a method of manufacturing the same are provided. The device includes a substrate including a cell region and a peripheral region, a gate pattern formed over the substrate in the peripheral region, a multi-layered structure formed over the gate pattern in the peripheral region, the multilayered structure including interlayer insulating layers and material layers for sacrificial layers, and a capping layer formed between the gate pattern and the multilayered structure in the peripheral region to cover the substrate, the capping layer configured to prevent diffusion of impurities from the material layers for the sacrificial layers into the substrate in the peripheral region.

9 Claims, 9 Drawing Sheets

(51) Int. Cl.
*H01L 27/11529* (2017.01)
*H01L 27/11548* (2017.01)
*H01L 27/11556* (2017.01)
*H01L 27/11573* (2017.01)
*H01L 27/11575* (2017.01)
*H01L 27/11582* (2017.01)

(52) U.S. Cl.
CPC .. *H01L 27/11548* (2013.01); *H01L 27/11556* (2013.01); *H01L 27/11573* (2013.01); *H01L 27/11575* (2013.01); *H01L 27/11582* (2013.01)

(58) Field of Classification Search
CPC ......... H01L 27/11556; H01L 27/11578; H01L 27/11582; H01L 29/0688; H01L 27/10885; H01L 27/10876; H01L 27/108; H01L 29/66666; H01L 29/7827; H01L 27/10841; H01L 29/7926
USPC ........................................................ 257/314
See application file for complete search history.

(56) References Cited

U.S. PATENT DOCUMENTS

| | | | |
|---|---|---|---|
| 2008/0014753 A1* | 1/2008 | Jang et al. .................... 438/703 |
| 2008/0067583 A1* | 3/2008 | Kidoh ................. H01L 21/8221 257/326 |
| 2008/0180994 A1* | 7/2008 | Katsumata ............... G11C 7/18 365/174 |
| 2009/0212350 A1* | 8/2009 | Kidoh et al. .................. 257/324 |
| 2009/0267135 A1* | 10/2009 | Tanaka .................. H01L 27/115 257/324 |
| 2009/0310425 A1* | 12/2009 | Sim .................... H01L 27/11526 365/185.29 |
| 2010/0133599 A1* | 6/2010 | Chae .................. H01L 27/11578 257/315 |
| 2010/0207195 A1* | 8/2010 | Fukuzumi .......... G11C 16/0483 257/326 |
| 2010/0320526 A1 | 12/2010 | Kidoh et al. |
| 2011/0284943 A1* | 11/2011 | Hwang ............... H01L 27/0207 257/314 |
| 2012/0064682 A1 | 3/2012 | Jang et al. |
| 2012/0146127 A1* | 6/2012 | Lee ................... H01L 21/28282 257/324 |
| 2012/0208347 A1* | 8/2012 | Hwang ............... H01L 27/1157 438/430 |
| 2013/0065386 A1* | 3/2013 | Kim .................... H01L 29/7926 438/591 |
| 2013/0248974 A1* | 9/2013 | Alsmeier ............... G11C 16/04 257/321 |

OTHER PUBLICATIONS

B. Schwarts, "Chemical Etching of Silicon", Solid-State Science and Technology, pp. 1903-1909, Dec. 1976).*
Office Action issued by the State Intellectual Property Office dated May 19, 2017.

* cited by examiner

NON-VOLATILE MEMORY DEVICE AND METHOD OF MANUFACTURING THE SAME

CROSS-REFERENCE TO RELATED APPLICATION

This application claims priority to and the benefit of Korean Patent Application No. 10-2012-0095036, filed on Aug. 29, 2012, the disclosure of which is incorporated herein by reference in its entirety.

BACKGROUND

Exemplary embodiments of the present invention relate to a semiconductor device. More specifically, the exemplary embodiments of the present invention relate to a 3-dimensional non-volatile memory device and a method of manufacturing the same.

In general, a semiconductor device may include memory cells arranged on a substrate in 2-D. To increase the integration density of semiconductor devices, various techniques for reducing the size of 2-D memory cells have been developed. However, there is a specific technical limit in reducing the size of the memory cells. To overcome the restrictions of a 2-D memory device, a 3-dimensional semiconductor device in which memory cells are on a substrate in 3-D to improve integration density, has been proposed.

The 3-dimensional semiconductor device may include memory cells stacked along a channel layer protruding from a substrate. Various techniques for increasing the reliability of the 3-dimensional semiconductor device have been proposed.

SUMMARY OF THE INVENTION

Exemplary embodiments of the present invention are directed to a non-volatile memory device and a method of manufacturing the same, which may improve the reliability of a 3-dimensional non-volatile memory device.

One aspect of the embodiment of the present invention provides a non-volatile memory device including a substrate including a cell region and a peripheral region, a gate pattern formed over the substrate in the peripheral region, a multi-layered structure formed over the gate pattern in the peripheral region, the multilayered structure including interlayer insulating layers and material layers for sacrificial layers, and a capping layer formed between the gate pattern and the multilayered structure in the peripheral region to cover the substrate, the capping layer configured to prevent diffusion of impurities from the material layers for the sacrificial layers into the substrate in the peripheral region.

Another aspect of the embodiment of the present invention provides a non-volatile memory device including a substrate including a cell region and a peripheral region, a gate pattern formed over the substrate in the peripheral region, a capping layer formed to cover the substrate and the gate pattern in the peripheral region, first conductive pattern formed in the cell region substantially in the same layer as the capping layer, first interlayer insulating layers and material layers for sacrificial layers alternately stacked over the capping layer in the peripheral region, second conductive patterns formed in the cell region substantially in the same layer as the material layers for the sacrificial layers, second interlayer insulating layers formed in the cell region substantially in the same layer as the first interlayer insulating layers, and a channel layer formed through the second interlayer insulating layers, the first conductive pattern, and the second conductive patterns.

Another aspect of the embodiment of the present invention provides a method of manufacturing a non-volatile memory device. The method includes forming a conductive layer over a substrate having a cell region and a peripheral region, etching the conductive layer to form a gate pattern in the peripheral region, forming a capping layer to cover the gate pattern and the substrate, and alternately stacking interlayer insulating layers and material layers for sacrificial layers over the capping layer.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EMBODIMENTS

The embodiments of the present invention will be described more fully hereinafter with reference to the accompanying drawings. This invention may, however, be embodied in different forms and should not be construed as limited to the embodiments set forth herein. Rather, these exemplary embodiments are provided so that this disclosure is thorough and complete and fully conveys the scope of the present invention to one skilled in the art.

It should be readily understood that the meaning of "on" and "over" in the present disclosure should be interpreted in the broadest manner such that "on" not only means "directly on" something but also include the meaning of "on" something with an intermediate feature or a layer therebetween, and that "over" not only means the meaning of "over" something may also include the meaning it is "over" something with no intermediate feature or layer therebetween (i.e., directly on something). In this specification, 'connected/coupled' represents that one component is directly coupled to another component or indirectly coupled through another component. In addition, a singular form may include a plural form as long as it is not specifically mentioned in a sentence.

Figure 1A:
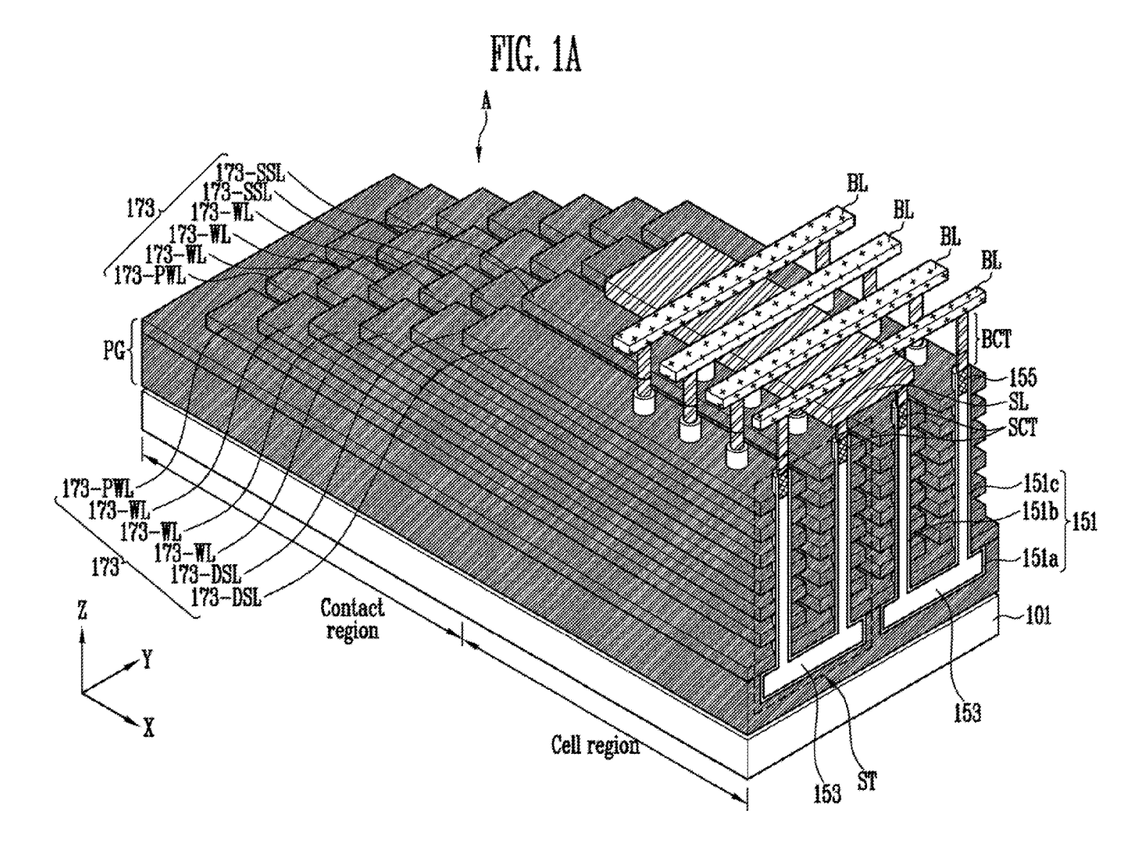
FIGS. 1A and 1B are diagrams illustrating a non-volatile memory device according to an exemplary embodiment of the present invention.
Figure 1B:
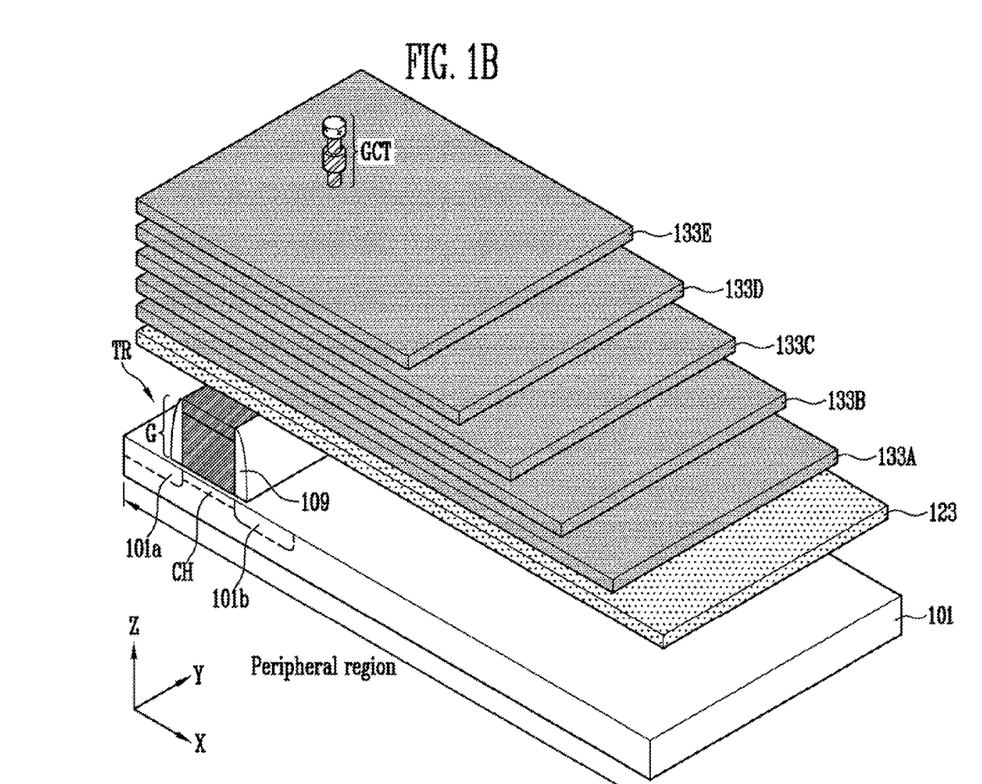

FIGS. 1A and 1B are diagrams illustrating a non-volatile memory device according to an exemplary embodiment of the present invention. In particular, FIG. 1A is a diagram of a contact region and a cell region, and FIG. 1B is a diagram of a peripheral region. Also, the illustration of a gate insulating layer and an interlayer insulating layer is omitted in FIGS. 1A and 1B.

Referring to FIGS. 1A and 1B, the non-volatile memory device according to the exemplary embodiment of the present invention may include memory strings ST formed in a cell region, a stepped structure A including conductive patterns 173 extending from the cell region to a contact region, and a circuit formed in a peripheral region. The circuit has a plurality of transistors TR configured to drive the memory strings ST.

Each of the memory strings ST may include a pipe gate PG formed on a substrate 101, a pipe channel layer 151a formed in the pipe gate PG, a source side channel layer 151b and a drain side channel layer 151c, which are connected to both ends of the pipe channel layer 151a and protrude from the pipe channel layer 151a, and conductive patterns 173, which are configured to surround each of the source side channel layer 151b and the drain side channel layer 151c, stacked, and spaced apart from one another.

Among the conductive patterns 173, conductive patterns disposed in a lowermost layer close to the substrate 101 (hereinafter, briefly referred to as lowermost conductive patterns) may be used as pass word lines 173_PWL, and conductive patterns disposed in at least one uppermost layer may be used as select lines. Among the conductive patterns used as the select lines, conductive patterns surrounding the source side channel layer 151b may be used as source select lines 173_SSL, and conductive patterns surrounding the drain side channel layer 151c may be used as drain select lines 173_DSL. Conductive patterns formed between the source select line 173_SSL and the pass word lines 173_PWL, and between the drain select lines 173_DSL and the pass word line 173_PWL may be used as word lines 173_WL. The pass word lines 173_PWL may be formed to the substantially the same thickness as the source select line 173_SSL, the word line 173_WL, and the drain select line 173_DSL, or to a smaller or greater thickness than the source select line 173_SSL, the word line 173_WL, and the drain select line 173_DSL.

A pipe transistor may be formed at an intersection between the pipe gate PG and the pipe channel layer 151. First memory cells may be formed at intersections between the word lines 173_WL and the source side channel layer 151b, and second memory cells may be formed at intersections between the word lines 173_WL and the drain side channel layer 151c. A source select transistor may be formed at an intersection between the source select line 173_SSL and the source side channel layer 151b, and a drain select transistor may be formed at an intersection between the drain select line 173_DSL and the drain side channel layer 151c.

In the above-described structure, each of the memory strings ST may include the source select transistor, the first memory cells, the pipe transistor, the second memory cells, and the drain select transistor, which may be connected in series along a channel layer 151. The channel layer 151 includes the pipe channel layer 151a and the source and drain side channel layers 151b and 151c, and the channel layer 151 may be formed in a U-shape.

The channel layer 151 may surround an insulating layer 153 filling a central portion of a U-shaped through region. The channel layer 151 may be formed in a tube shape along the surface of the U-shaped through region, or in such a shape to fill the U-shaped through region. When the channel layer 151 has the tube shape, the insulating layer 153 surrounded with the channel layer 151 may be formed to a height substantially the same or lower than the channel layer 151. When the insulating layer 153 is formed to a lower height than the channel layer 151, a buried pattern 155 may be further formed within the opened U-shape through region on the insulating layer 153. The channel layer 151 and the buried pattern 155 may include a silicon layer. In particular, the buried pattern 155 may include a doped silicon layer and used as a junction connected to the channel layer 151.

Although not shown, an outer wall of the channel layer 151 may be surrounded with a charge storage layer (not shown). In this case, a tunnel insulating layer (not shown) may be formed between the channel layer 151 and the charge storage layer. In addition, a dielectric layer (not shown) may be formed to surround an outer wall of the charge storage layer. Alternatively, the charge storage layer may be formed along the surfaces of the conductive patterns 173. In this case, a tunnel insulating layer may be further formed between the charge storage layer and the channel layer 151. Furthermore, a dielectric layer may be further formed between the charge storage layer and the conductive patterns 173.

The source side channel layer 151b or the buried pattern 155 connected to the source side channel layer 151 may be connected to a source line SL formed on the memory string ST, and the drain side channel layer 151c or the buried pattern 155 connected to the drain side channel layer 151c may be connected to a bit line BL. If the memory string ST and the source line SL are formed apart each other, the source line SL may be connected to the source side channel layer 151b or the buried pattern 155 through a source contact SCT formed under the source line SL. If the memory string ST and the bit line BL are formed apart from each other, the bit line BL may be connected to the drain side channel layer 151c or the buried pattern 155 through a bit line contact BCT formed under the bit line BL.

To form the stepped structure A, the conductive patterns 173, which may extend from the cell region to the contact region, may be patterned to further protrude downward toward the substrate. Due to the stepped structure A, contact plugs (not shown) may be connected to the conductive patterns 173.

The transistor TR formed in the peripheral region may include a gate pattern G, a channel region CH formed in the substrate 101 disposed under the gate pattern G, and a source region 101a and a drain region 101b formed in the substrate 101 on both sides of the channel region CH. A capping layer 123 may be formed on the gate pattern G and the substrate 101 in the peripheral region, and material layers 133A to 133E for sacrificial layers may be formed on the capping layer 123.

The capping layer 123 may be formed in the same layer as the pass word lines 173_PWL, which may correspond to the lowermost conductive patterns of the conductive patterns 173, and the material layers 133A to 133E for sacrificial layers may be formed in the same layer as the remaining conductive patterns except for the lowermost conductive patterns of the conductive patterns 173. The capping layer 123 may be formed to the substantially the same thickness as or a smaller or greater thickness than the material layers 133A to 133E for sacrificial layers.

The capping layer 123 and the material layers 133A to 133E for sacrificial layers may be stacked to define regions in which the conductive patterns 173 will be formed, in the cell region. The capping layer 123 and the material layers 133A to 133E for sacrificial layers may be removed from the cell region and remain in the peripheral region. The capping layer 123 and the material layers 133A to 133E for sacrificial layers may include a material having a high etch selectivity with respect to an interlayer insulating layer due to the characteristics of a manufacturing process of a non-volatile memory device according to an exemplary embodiment of the present invention. For example, the capping layer 123 and the material layers 133A to 133E for sacrificial layers may include a nitride layer.

The material layers 133A to 133E for sacrificial layers may be formed using a plasma-enhanced chemical vapor deposition (PE-CVD) process, which may facilitate alternate deposition of the material layers 133A to 133E for sacrificial layers and the interlayer insulating layers. Due to the characteristics of the PE-CVD process, impurities (e.g., hydrogen (H) ions and positive charges) may be contained at a high content in the material layers 133A to 133E for sacrificial layers.

The capping layer 123 may be formed under the material layers 133A to 133E for sacrificial layers and prevent diffusion of impurities from the material layers 133A to 133E for sacrificial layers into the peripheral region of the substrate 101, particularly, the channel region CH and the source and drain regions 101a and 101b. Thus, the capping layer 123 may reduce degradation of the characteristics of the transistor TR due to the diffusion of the impurities. In addition the capping layer 123 may be formed using a low-pressure CVD (LP-CVD) process in a vacuum state. Since the capping layer 123 formed using the LP-CVD process contains impurities at a much lower concentration than the material layers 133A to 133E for sacrificial layers formed using the PE-CVD process, degradation of the characteristics of the transistor TR may be reduced.

The capping layer 123 and the material layers 133A to 133E for sacrificial layers may be penetrated by a gate contact GCT connected to a gate of the transistor TR, penetrated by a drain contact (not shown) connected to the drain region 101b of the transistor TR, or a source contact connected to the source region 101a of the transistor TR.

FIGS. 2A through 2F are cross-sectional views illustrating a method of manufacturing a non-volatile memory device according to an exemplary embodiment of the present invention.

Figure 2A:
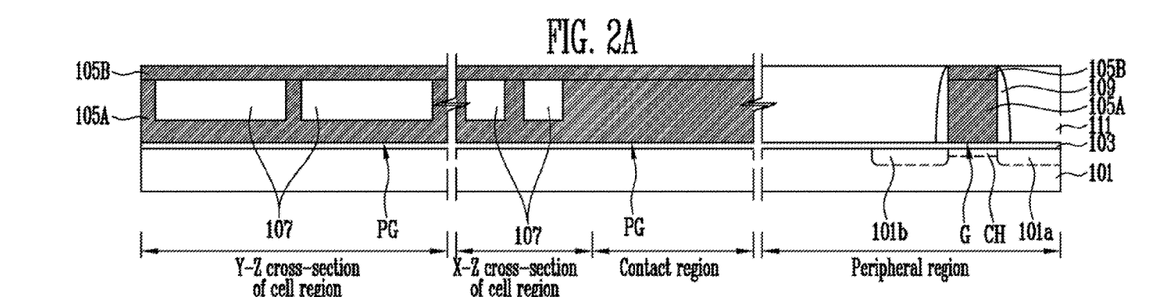
FIGS. 2A through 2F are cross-sectional views illustrating a method of manufacturing a non-volatile memory device according to an exemplary embodiment of the present invention.

Referring to FIG. 2A, impurities for forming a well structure (not shown) and impurities for controlling a threshold voltage may be implanted into a substrate 101 including a cell region, a contact region, and a peripheral region. Thereafter, an isolation layer (not shown) may be formed within a trench formed by etching the substrate 101.

Thereafter, a gate insulating layer 103 and a first conductive layer 105A may be formed on the substrate 101. The gate insulating layer 103 may include a silicon oxide layer. Subsequently, a portion of the first conductive layer 105A may be etched to form a pipe trench in the cell region, and the pipe trench may be filled with a sacrificial layer 107. The sacrificial layer 107 may include an oxide layer. Subsequently, a second conductive layer 105B may be further formed on the first conductive layer 105A so that the sacrificial layer 107 may be buried.

Thereafter, the first and second conductive layers 105A and 105B may be etched so that pipe gates PG may be separated from one another in memory block units in the cell region, and gate patterns G of transistors are formed in the peripheral region. The pipe gates PG and the gate patterns G may be patterned using a photolithography process.

Next, impurity implantation processes may be performed to form source and drain regions 101a and 101b on both sides of each of the gate patterns G formed in the peripheral region. The impurity implantation processes may include a first impurity implantation process for implanting impurities at a first concentration, and a second impurity implantation process for implanting impurities at a second concentration higher than the first concentration. In this case, after an impurity implantation mask (not shown) for opening the regions disposed on both sides of the gate pattern G may be formed, the first impurity implantation process may be performed on the regions opened by the impurity implantation mask. In addition, after spacers 109 are formed on both sides of the gate pattern G, the second impurity implantation process may be performed on the regions opened by the spacers 109 and the impurity implantation mask. The impurity implantation mask may be removed after the second impurity implantation process. Due to the impurity implantation process, the source region 101a and the drain region 101b including an impurity implantation region having a first concentration and an impurity implantation region having a second concentration, may be formed in the substrate 101 on both sides of the gate pattern G. A channel region CH may be defined in the substrate 101 between the source and drain regions 101a and 101b.

Afterwards, spaces between the gate patterns G and the pipe gates PG may be filled with an insulating layer 111. The insulating layer 111 may be formed to such a thickness to fill the spaces between the gate patterns G and the pipe gates PG. Also, the insulating layer 111 may be planarized using a planarization process, such as a chemical mechanical polishing (CMP) process, until the gate patterns G and the pipe gates PG are exposed. The insulating layer 111 may include an oxide layer.

Figure 2B:
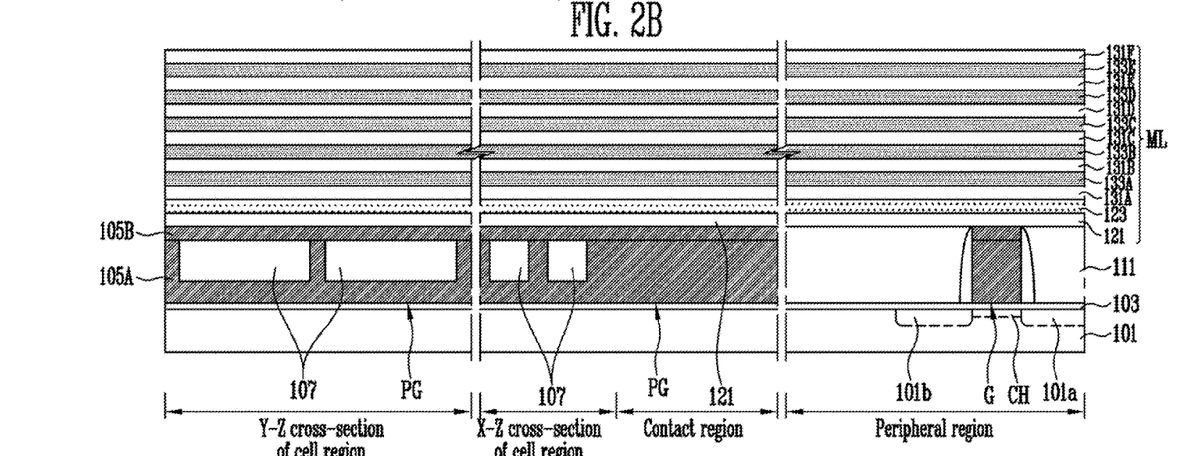

Referring to FIG. 2B, a multilayered structure ML may be formed on the insulating layer 111 and the substrate 101 having the gate patterns G and the pipe gates PG. The multilayered structure ML may include a capping layer 123, and interlayer insulating layers 131A to 131F and material layers 133A to 133E for sacrificial layers alternately stacked on the capping layer 123. The multilayered structure ML may further include an interlayer insulating layer 121 formed under the capping layer 123.

The capping layer 123 and the material layers 133A to 133E for sacrificial layers may define regions in which conductive patterns will be formed. The capping layer 123 and the material layers 133A to 133E for the sacrificial layers may include a material layer having a high etch selectivity with respect to the interlayer insulating layers 121 and 131A to 131E. For instance, the interlayer insulating layers 121 and 131A to 131F may include an oxide layer, and the capping layer 123 and the material layers 133A to 133E for the sacrificial layers may include a nitride layer.

The interlayer insulating layers 131A to 131F and the material layers 133A to 133E for the sacrificial layers, which may be alternately deposited on the capping layer 123, may be formed using a PE-CVD process, which may facilitate the alternate deposition. To reduce diffusion of impurities into the substrate 101 disposed under the capping layer 123, the capping layer 123 may be formed using an LP-CVD process. Also, the interlayer insulating layer 121 and the insulating layer 111 formed under the capping layer 123 may also be formed using a method (e.g., an LP-CVD process) other than a PE-CVD process to further reduce the diffusion of impurities into the substrate 101.

Figure 2C:
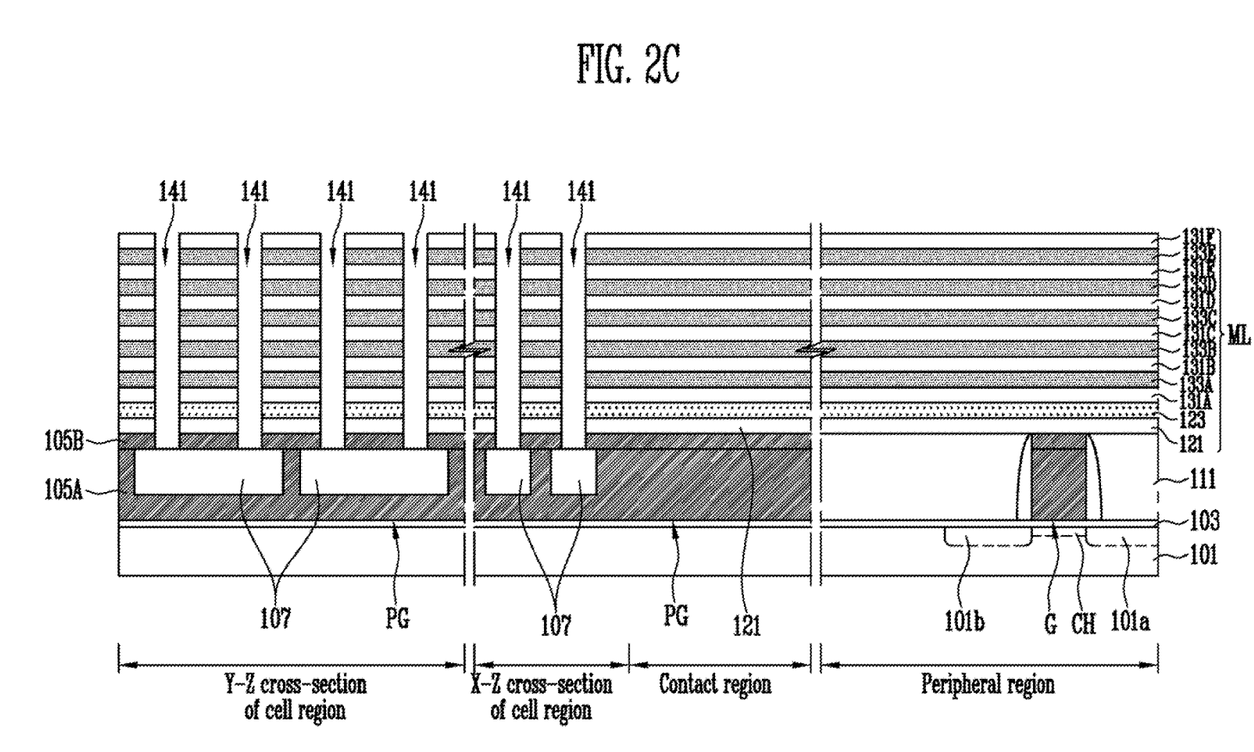

Referring to FIG. 2C, openings 141 may be formed to penetrate the multilayered structure ML and open the sacrificial layer 107. When the second conductive layer 105b is formed on the sacrificial layer 107, the openings 141 may further penetrate the second conductive layer 105B.

The openings 141 may be formed by etching the multilayered structure ML and the second conductive layer 105b using an etch barrier formed using a photolithography process as a mask. The etch barrier may be removed after forming the openings 141.

Each of the sacrificial layers 107 may be exposed by a pair of openings 141. In this case, the pair of openings 141 may be disposed on both sides of the sacrificial layer 107.

Figure 2D:
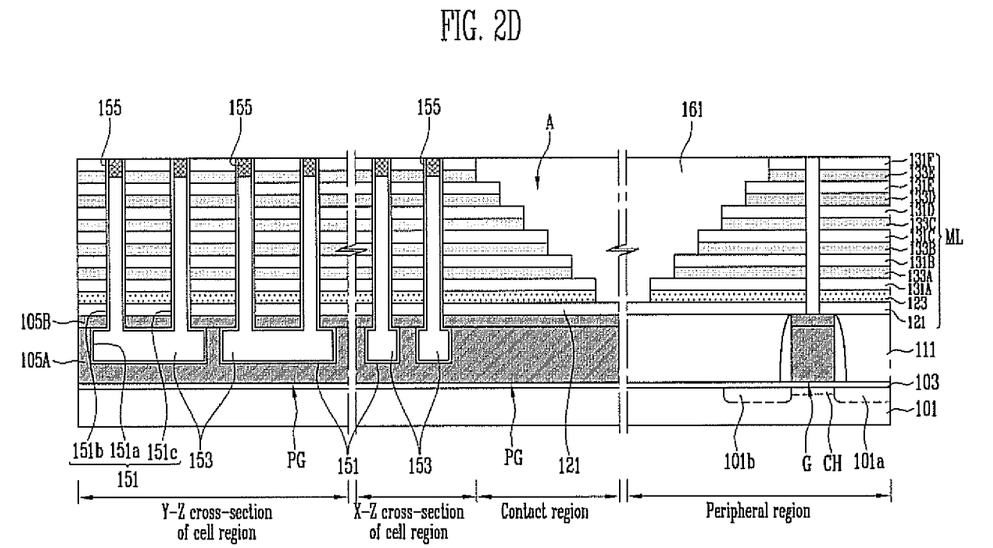

Referring to FIG. 2D, the sacrificial layers 107 exposed by the openings 141 may be removed using an etching process. In this case, to protect the interlayer insulating layers 121 and 131A to 131F, before removing the sacrificial layers 107, a protection layer (not shown) having a high etch selectivity with respect to the sacrificial layers 107 may be further formed on sidewalls of the openings 141. In this case, the protection layer may be removed after removing the sacrificial layers 107. Due to the removal of the sacrificial layers 107, the pair of openings 141 may be connected to form a U-shape.

Thereafter, a channel layer 151 may be formed along the surface of the U-shape opening. The channel layer 151 may include a silicon layer. Although not shown in the drawings, before forming the channel layer 51, a tunnel insulating layer (not shown) may be further formed along the surface of the U-shape opening. Also, a charge storage layer (not shown) may be further formed before forming the tunnel insulating layer. Furthermore, a dielectric layer (not shown) may be further formed before forming the charge storage layer.

After forming the channel layer 151, the U-shape opening may be filled with an insulating layer 153. The insulating layer 153 may include a spin-on-dielectric (SOD) layer, which may easily fill a narrow space. Thereafter, a process of etching a portion of the insulating layer 153 may be further performed to open an upper portion of the U-shape opening. In this case, the opened upper portion of the U-shape opening may be filled with a buried pattern 155. The buried patter 155 may include a doped silicon layer.

Unlike described above, the channel layer 151 may be formed to fill the U-shape opening. In this case, the processes of forming the insulating layer 153 and the buried pattern 155 may be omitted.

Thereafter, a photoresist pattern (not shown) may be formed on the multilayered structure ML to cut off the peripheral region and define a stepped structure in the contact region. The uppermost interlayer insulating layer 131F and the uppermost material layer 133E for the sacrificial layer, which may be opened by the photoresist pattern, may be etched using the photoresist pattern as a mask. Afterwards, the photoresist pattern may be shrunk by etching, and the opened uppermost interlayer insulating layer 131F and the opened uppermost material layer 133E for the sacrificial layer may be etched using the shrunk photoresist pattern as a mask. In this case, during the etching of the uppermost interlayer insulating layer 131F and the uppermost material layer 133E for the sacrificial layer, the underlying interlayer insulating layer 131E and the underlying material layer 133D for the sacrificial layer may be etched together. The shrinkage of the photoresist pattern and the etching of the multilayered structure ML may be repeated until the capping layer 123 disposed as the lowermost layer of the multilayered structure ML is opened to protrude more than the material layer 133A for the sacrificial layer disposed on the capping layer 123. Thus, the stepped structure A may be patterned so that end portions of the capping layer 123 and the material layer 133A for the sacrificial layer further protrude downward toward the substrate 101.

Subsequently, a region from which the multilayered structure ML is etched may be filled with an insulating layer 161.

Figure 2E:
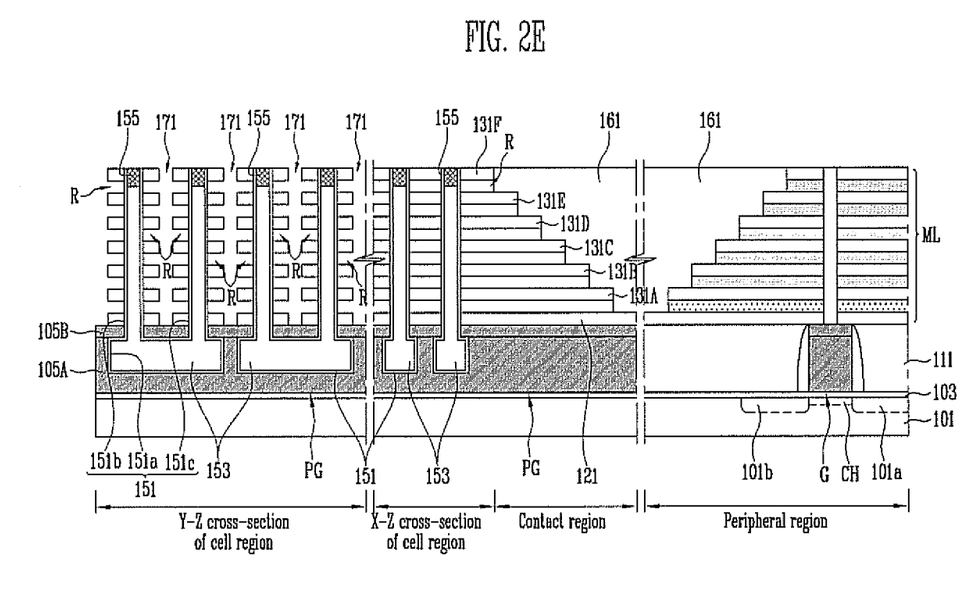

Referring to FIG. 2E, the multilayered structure ML disposed between the openings (refer to 141 in FIG. 2C) may be etched in the cell region to form a slit 171. The slit 171 may open the capping layer 123 and the material layers 133A to 133E for the sacrificial layers, which may be formed in a region in which conductive patterns will be formed.

Thereafter, the capping layer 123 and the material layers 133A to 133E for the sacrificial layers, which may be exposed through the slit 171, may be removed in the cell region to form recess regions R. The recess regions R, in which conductive patterns will be formed, may be formed between the interlayer insulating layers 121 and 131A to 131F disposed in adjacent layers in the cell region. Meanwhile, the capping layer 123 and the material layers 133A to 133E for the sacrificial layers, which may be formed in the peripheral region, may remain. The recess regions R may be formed by selectively etching the capping layer 123 and the material layers 133A to 133E for the sacrificial layers using an etchant having a high etch selectivity with respect to the interlayer insulating layers 121 and 131A to 131F.

Figure 2F:
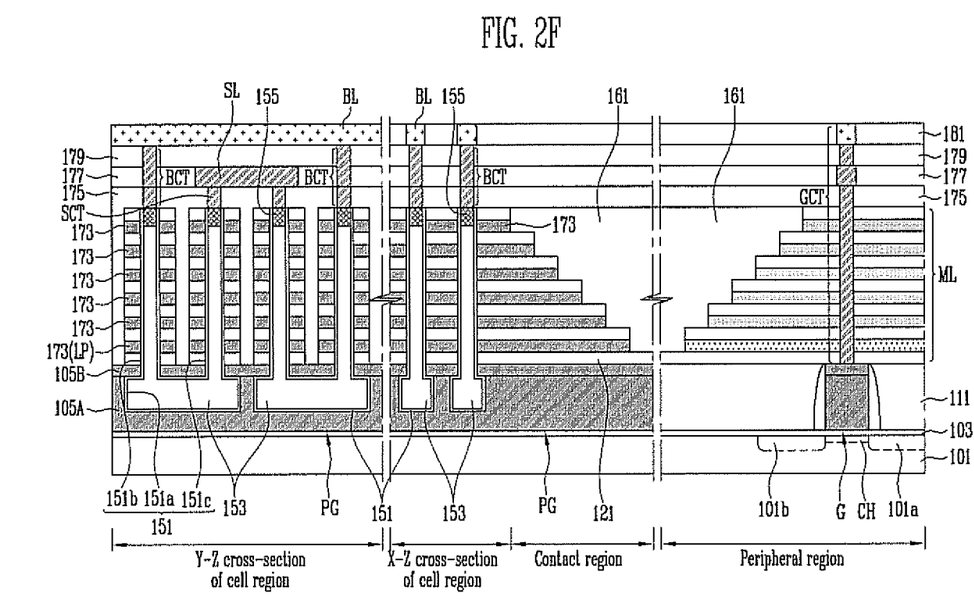

Referring to FIG. 2F, after filling the recess regions R with a conductive layer, the conductive layer formed within the slit 171 may be removed using an etching process, so conductive patterns 173 may be formed within the recess regions R and separated from one another by the slit 171. Prior to the formation of the channel layer 151 described above with reference to FIG. 2D, any one of a tunnel insulating layer, a charge storage layer, and a dielectric layer may not be formed in the openings. In this case, although not shown in the drawings, before forming the conductive patterns 173, any one of a tunnel insulating layer, a charge storage layer, and a dielectric layer may be further formed along the surfaces of the recess regions R.

Subsequently, an insulating layer 175 may be formed on the entire structure having the conductive patterns 173 to such a thickness to fill the slit 171. After forming the insulating layer 175, a first region of a bit line contact BCT and a source contact SCT may be formed through the insulating layer 175 and connected to the buried pattern 155. Also, after forming the insulating layer 175, a first region of a gate contact GCT may be formed through the insulating layer 175 and the multilayered structure ML in the peripheral region, and connected to the gate pattern G of the transistor.

Thereafter, an insulating layer 177 may be formed on the entire structure having the first region of the bit line contact BCT, the source contact SCT, and the first region end portion of the gate contact GCT. A source line SL may be formed through the insulating layer 177 and connected to the source contact SCT. Also, a second region of the gate contact GCT may be further formed through the insulating layer 177 and connected to the first region of the gate contact GCT.

After that, an insulating layer 179 may be formed on the entire structure having the source line SL. Next, a second region of the bit line contact BCT may be formed through the insulating layers 177 and 179 formed on the first region of the bit line contact BCT and connected to the first region of the bit line contact BCT. Also, a third region of the gate contact GCT may be further formed through the insulating layer 179 and connected to the second region of the gate contact GCT.

An insulating layer 181 may be formed on the entire structure having the second region of the bit line contact BET. Thereafter, a bit line BL may be formed through the insulating layer 181 and connected to the bit line contact BCT. In this case, a fourth region of the gate contact GCT may be further formed through the insulating layer 181 and connected to the third region of the gate contact GCT.

Figure 3:
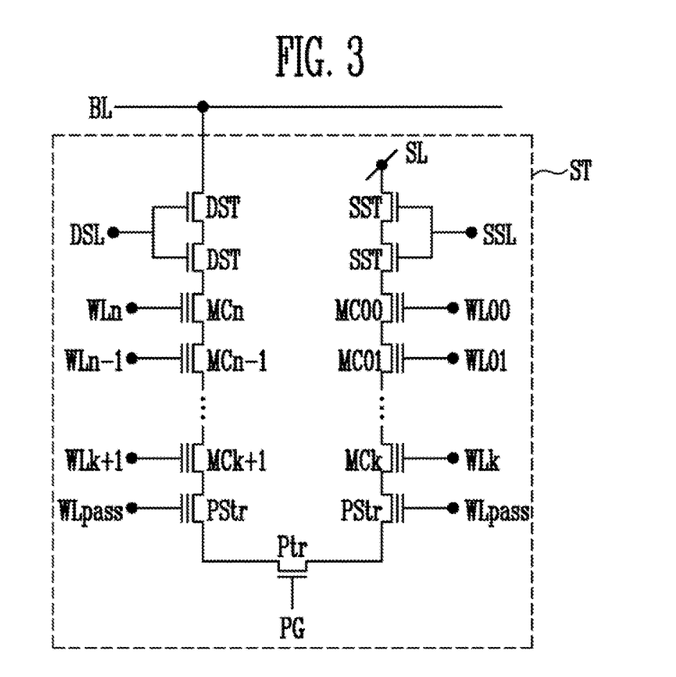
FIG. 3 is a circuit diagram illustrating a non-volatile memory device according to an exemplary embodiment of the present invention.

FIG. 3 is a circuit diagram illustrating a non-volatile memory device according to an exemplary embodiment of the present invention.

Referring to FIG. 3, the non-volatile memory device according to the exemplary embodiment of the present invention may include a memory string ST connected between a bit line BL and a source line SL. Although not shown in FIG. 3, a plurality of memory strings ST may constitute a memory block. One ends of the memory strings constituting the memory block may be connected in common to the source line SL, and other ends of the memory strings constituting the memory block may be connected to a plurality of bit lines. Each of the memory strings ST may include serially connected memory cells MC00 to MCn, pass transistors PStr, a pipe transistor Ptr at least one source select transistor SST, and at least one drain select transistor DST.

Threshold voltages of the memory cells MC00 to MCn may vary based on the amount of charges stored in the charge storage layer. By controlling the threshold voltages of the memory cells MC00 to MCn, data may be rewritten in the memory cells MC00 to MCn.

Memory cells MCk and MCk+1 disposed in a lowermost layer (hereinafter, briefly referred to as lowermost memory cells MCk and MCk+1) may be connected to the pass transistors PStr. The pass transistors PStr may not be used as memory cells. During a program or read operation, a pass voltage may be supplied to pass word lines WLpass functioning as gates of pass transistors PStr of a selected memory block to provide a current path. During an erase operation, a voltage having the same level as an erase voltage supplied to the word lines WL00 to WLn functioning as gates of memory cells MC00 to MCn of the selected memory block, may be supplied to the pass word lines WLpass of the selected memory block.

The pipe transistor Ptr may be connected between the pass transistors PStr. At least one source select transistor SST may be connected between the source line SL and the memory cell MC00, and at least one drain select transistor DST may be connected between the bit line BL and the memory cell MCn. When at least two source select transistors SST constitute the memory string ST, the source select lines SSL functioning as gates of the source select transistors SST may be connected to one another. When at least two drain select transistors DST constitute the memory string ST, the drain select lines DSL functioning as gates of the drain select transistors DST may be connected to one another.

The erase operation of the non-volatile memory device according to the present embodiment may cause a gate induced drain leakage (GIDL) current from sides of the source select transistor SST and the drain select transistor DST. Thus, as positions of the memory cells MC00 to MCn become far away from the source select transistor SST and the drain select transistor DST, an erase-state threshold voltage may increase. In particular, since an erase-state threshold voltage of a memory cell adjacent to the pipe transistor Ptr is high, erase characteristics may be degraded. In the present embodiment, a device adjacent to the pipe transistor Ptr, which may result in the degradation of the erase characteristics, may be used not as a memory cell but as the pass transistor PStr and thus, distribution of erase-state threshold voltages may be improved.

Figure 4:
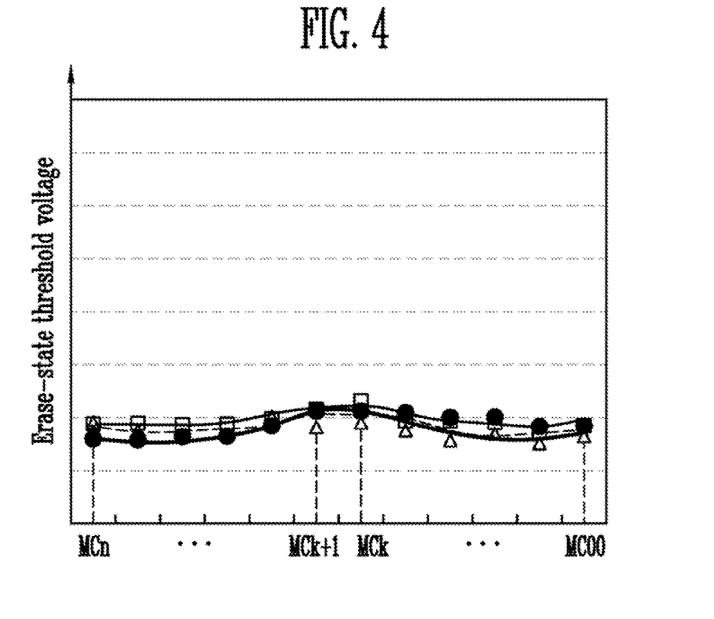
FIG. 4 is a graph illustrating erase characteristics of a non-volatile memory device according to an exemplary embodiment of the present invention.

FIG. 4 is a graph illustrating erase characteristics of a non-volatile memory device according to an exemplary embodiment of the present invention.

Referring to FIG. 4, when the pass transistors PStr are connected between the lowermost memory cells MCk and MCk+1 and the pipe transistor Ptr as shown in FIG. 3 the distribution of erase state threshold voltages may be more uniform than when the lowermost memory cells MCk and MCk+1 are directly connected to the pipe transistor Ptr.

Although a case in which a memory string including a U-shaped channel layer is formed in a cell region is described above, the present invention is not limited thereto. For example, although not shown, a memory string including a lower select transistor, memory cells, and an upper select transistor stacked along a channel layer protruding from a substrate by interposing an interlayer insulating layer, may be formed in the cell region. In this case, a lower select gate of the lower select transistor and a gate pattern of a peripheral region transistor may be formed at the same time. Thereafter, a first channel layer may be formed through the lower select gate, and impurity implantation processes may be performed to form a source region and a drain region on both sides of a gate pattern disposed in a peripheral region. A gate insulating layer may be further formed before forming the first channel layer. Afterwards, an insulating layer may be formed to fill a space between the lower select gate and the gate pattern disposed in the peripheral region. Next, a multilayered structure may be formed in the same manner as described above with reference to FIG. 2B. After that, openings may be formed through the multilayered structure in the same manner as described with reference to FIG. 2C. In this case, the openings may open the first channel layer. Next a second channel layer may be formed in the openings and connected to the first channel layer. Before forming the second channel layer, a dielectric layer, a charge storage layer, and a tunnel insulating layer may be further formed.

Thereafter, the multilayered structure may be etched to form a stepped structure, and a region in which the multilayered structure is etched may be filled with an insulating layer. Afterwards, as described above with reference to FIG. 2E, the multilayered structure may be etched in the cell region to form a slit, and a capping layer of the multilayered structure and material layers for sacrificial layers, which may be exposed through the slit, may be removed to form recess regions. Subsequently, conductive patterns may be formed within the recess regions. In this case, conductive patterns disposed in at least one uppermost layer, out of the conductive patterns, may be used as upper select gates of upper select transistors, and the remaining underlying conductive patterns may be used as word lines of the memory cells. Meanwhile, all the conductive patterns filling the recess regions may be used as word lines. In this case, a subsequent process for forming an upper select transistor may be further performed.

Figure 5:
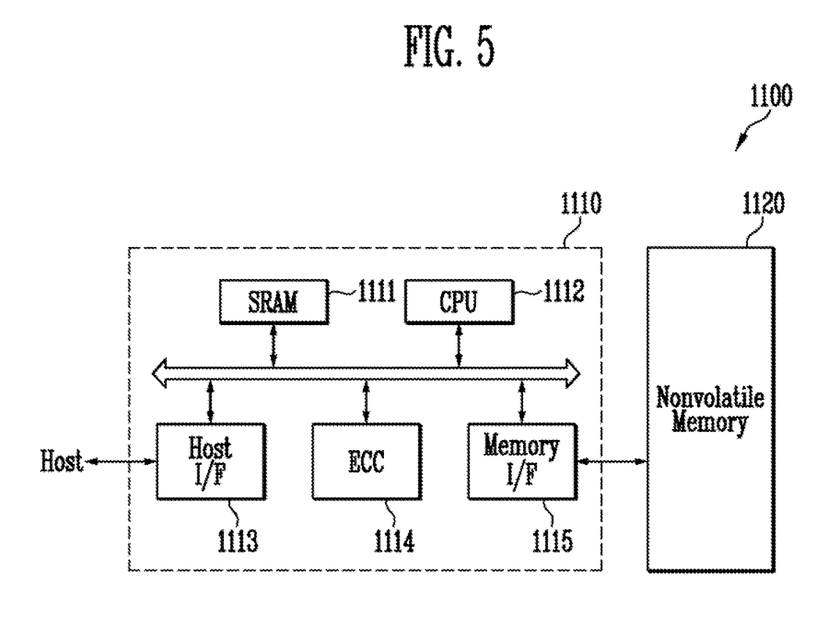
FIG. 5 is a construction diagram illustrating a memory system according to an exemplary embodiment of the present invention.

FIG. 5 is a block diagram illustrating a memory system 1100 according to an exemplary embodiment of the present invention.

Referring to FIG. 5, the memory system 1100 according to the embodiment of the present invention may include a non-volatile memory device 1120 and a memory controller 1110.

The non-volatile memory device 1120 may include a non-volatile memory device described in the previous embodiments with reference to FIGS. 1 through 3. Furthermore, the non-volatile memory device 1120 may be a multi-chip package including a plurality of flash memory chips.

The memory controller 1110 may be configured to control the non-volatile memory device 1120, and include a static random access memory 1111, a central processing unit (CPU) 1112, a host interface 1113, an error correction code (ECC) block 1114, and a memory interface 1115. The SRAM 1111 may be used as an operation memory of the CPU 1112. The CPU 1112 may perform general control operations so that the memory controller 1110 may exchange data. The host interface 1113 may include a data exchange protocol of a host connected to the memory system 1100. Also, the ECC block 1114 may detect and correct errors included in data read from the non-volatile memory device 1120, and the memory interface 1115 may interface with the non-volatile memory device 1120. In addition, the memory controller 1110 may further include a read-only memory (ROM) configured to store code data required to interface with the host.

The memory system 1100 having the above-described construction may be a memory card or solid-state disk (SSD) which the non-volatile memory device 1120 is combined with the memory controller 1110. For example, when the memory system 1100 is an SSD, the memory controller 1110 may communicate with the outside (e.g., the host) through one of various interface protocols, such as a universal serial bus (USB), man machine communication (MMC), a peripheral component interconnect-express (PCI~E), a serial advanced technology attachment (SATA), a parallel advanced technology attachment (DATA), a small computer system interface (SCSI), an enhanced small device interface (ESDI), or intelligent drive electronics (IDE).

Figure 6:
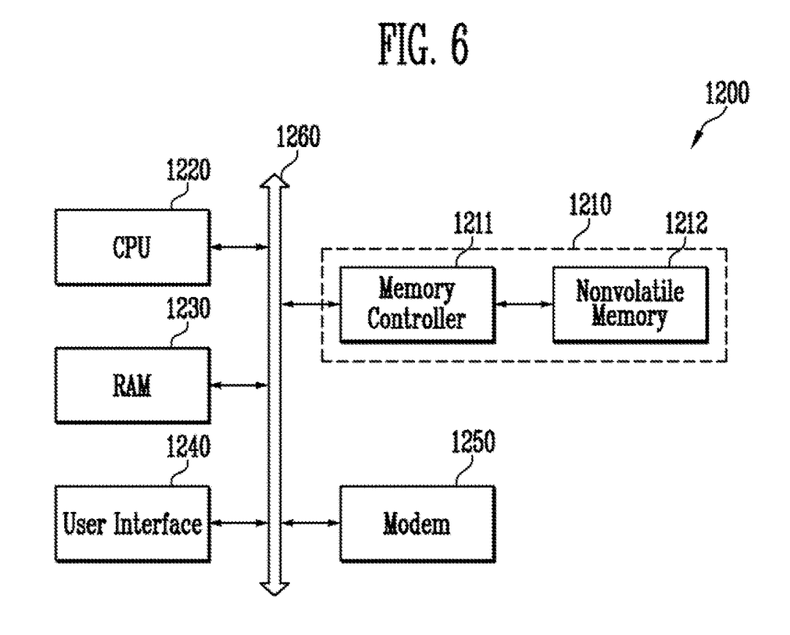
FIG. 6 is a construction diagram illustrating a computing system according to an exemplary embodiment of the present invention.

FIG. 6 is a block diagram illustrating a computing system 1200 according to an exemplary embodiment of the present invention.

Referring to FIG. 6, the computing system 1200 according to the exemplary embodiment of the present invention may include a CPU 1220, a RAM 1230, a user interface 1240, a modem 1250, and a memory system 1210, which may be connected to a system bus 1260. In addition, when the computing system 1200 is a mobile device, the computing system 1200 may include a battery configured to supply an operating voltage to the computing system 1200, and further include an application chipset, a camera image processor (CIS), and/or a mobile dynamic RAM (DRAM).

As described with reference to FIG. 5, the memory system 1210 may include a non-volatile memory 1212 and a memory controller 1211.

According to the present invention, a substrate may be protected with a capping layer in a peripheral region so that diffusion of impurities into a channel of a transistor formed in the peripheral region may be reduced to improve reliability of a non-volatile memory device.

In the drawings and specification, typical exemplary embodiments of the invention have been disclosed. Although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A non-volatile memory device comprising:
   a substrate including a cell region and a peripheral region;
   a gate pattern formed over the substrate in the peripheral region;
   a multilayered structure formed over the gate pattern in the peripheral region, the multilayered structure including interlayer insulating layers and sacrificial layers; and
   a capping layer formed between the gate pattern and the multilayered structure in the peripheral region to cover the substrate,
   wherein the sacrificial layers and the capping layer include impurities and are configured to be selectively etched with respect to the interlayer insulating layers by using a same etchant, and the capping layer has a lower concentration of impurities than the sacrificial layers,
   wherein the impurities include hydrogen (H) ions and positive charges.

2. The non-volatile memory device of claim 1, further comprising:
   conductive patterns connected to memory strings and stacked over the cell region, wherein the conductive patterns are spaced from each other.

3. The non-volatile memory device of claim 2, wherein the conductive patterns include a lowermost conductive pattern formed in the same level as the capping layer, and remaining conductive patterns formed in the same level as the sacrificial layers.

4. The non-volatile memory device of claim 2, further comprising:
   channel layers passing through the conductive patterns.

5. The non-volatile memory device of claim 2, further comprising:
   a pipe gate formed under the conductive pattern in the cell region;
   a pipe channel layer; and
   a source side channel layer and a drain side channel layer connected to both ends of the pipe channel layer, the source and drain side channel layers passing through the conductive patterns.

6. The non-volatile memory device of claim 5, wherein the pipe gate is formed in the same level as the gate pattern.

7. The non-volatile memory device of claim 2, wherein a stack of the conductive patterns over the cell region is separated from the multilayered structure over the peripheral region.

8. The non-volatile memory device of claim 7, wherein the stack of the conductive patterns has a stepped structure.

9. The non-volatile memory device of claim 1, wherein the multilayered structure has a stepped structure.

* * * * *